US012386404B2

United States Patent
Hur et al.

(10) Patent No.: US 12,386,404 B2
(45) Date of Patent: Aug. 12, 2025

(54) SERVER DEVICE CAPABLE OF BEING STABLY OPERATED IN SPITE OF POWER LOSS AND METHOD OF OPERATING THE SAME

(71) Applicant: Samsung Electronics Co., Ltd., Suwon-si (KR)

(72) Inventors: Sung Chul Hur, Suwon-si (KR); Sang-Hwa Jin, Suwon-si (KR); Hwaseok Oh, Suwon-si (KR); Bumjun Kim, Suwon-si (KR); Brianmyungjune Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 177 days.

(21) Appl. No.: 18/167,263

(22) Filed: Feb. 10, 2023

(65) Prior Publication Data

US 2023/0384847 A1 Nov. 30, 2023

(30) Foreign Application Priority Data

May 31, 2022 (KR) .................. 10-2022-0067026
Jun. 8, 2022 (KR) .................. 10-2022-0069618
Aug. 11, 2022 (KR) .................. 10-2022-0100847

(51) Int. Cl.
*G06F 1/26* (2006.01)
*G06F 1/18* (2006.01)
(Continued)

(52) U.S. Cl.
CPC .............. *G06F 1/263* (2013.01); *G06F 1/30* (2013.01)

(58) Field of Classification Search
CPC ........... G06F 1/263; G06F 1/30; G06F 1/3203
See application file for complete search history.

(56) References Cited

U.S. PATENT DOCUMENTS 9,939,873 B1 4/2018 Catalano et al.
9,946,610 B2 4/2018 Kinoshita
(Continued)

FOREIGN PATENT DOCUMENTS

WO WO-2015/164794 A1 10/2015

OTHER PUBLICATIONS

Extended European Search Report issued Oct. 20, 2023 in European Application No. 23168192.5.

*Primary Examiner* — Jaweed A Abbaszadeh
*Assistant Examiner* — Gayathri Sampath
(74) *Attorney, Agent, or Firm* — Harness, Dickey & Pierce, P.L.C.

(57) ABSTRACT

Provided is a server device which may be stably operated in spite of power loss and a method of operating the same. The server device according to an embodiment of the present invention includes: a host system; a plurality of memory modules; a backplane configured to transmit main power supplied from the host system to the plurality of memory modules; and at least one replaceable battery module connected to the backplane and configured to supply first auxiliary power to the plurality of memory modules, wherein the plurality of memory modules includes a volatile memory, a non-volatile memory; and a memory module controller using the first auxiliary power supplied from the at least one replaceable battery module to maintain data of the volatile memory or flush data of the volatile memory to the non-volatile memory, in response to the power loss occurring in the main power.

19 Claims, 15 Drawing Sheets

(51) Int. Cl.
    *G06F 1/30*     (2006.01)
    *G11C 5/14*     (2006.01)
    *G11C 16/30*     (2006.01)

(56) References Cited

U.S. PATENT DOCUMENTS

| | | |
|---|---|---|
| 10,671,134 B2 | 6/2020 | Karidis et al. |
| 10,776,153 B2 | 9/2020 | Kanno |
| 10,976,795 B2 | 4/2021 | Nayak et al. |
| 11,102,908 B1 | 8/2021 | Komori et al. |
| 2009/0125156 A1* | 5/2009 | Killian .................. G06F 1/263 700/297 |
| 2010/0332858 A1* | 12/2010 | Trantham ................ G06F 1/263 713/300 |
| 2015/0309951 A1* | 10/2015 | Breakstone ........... G06F 3/0625 710/313 |
| 2016/0118121 A1* | 4/2016 | Kelly ....................... G06F 1/30 710/301 |
| 2017/0091042 A1 | 3/2017 | Chou et al. |
| 2017/0262344 A1* | 9/2017 | Shaw .................... G06F 3/0619 |
| 2018/0335817 A1 | 11/2018 | Lin et al. |
| 2021/0034130 A1 | 2/2021 | Guim Bernat et al. |
| 2021/0089225 A1 | 3/2021 | Boyd |
| 2022/0011945 A1 | 1/2022 | Coleman et al. |
| 2022/0012141 A1 | 1/2022 | Kim et al. |
| 2022/0155973 A1 | 5/2022 | Lim et al. |

\* cited by examiner

SERVER DEVICE CAPABLE OF BEING STABLY OPERATED IN SPITE OF POWER LOSS AND METHOD OF OPERATING THE SAME

CROSS-REFERENCE TO RELATED APPLICATIONS

This application claims priority under 35 U.S.C. § 119 to Korean Patent Application No. 10-2022-0067026 filed on May 31, 2022, in the Korean Intellectual Property Office, Korean Patent Application No. 10-2022-0069618 filed on Jun. 8, 2022, and Korean Patent Application No. 10-2022-0100847 filed on Aug. 11, 2022 in the Korean Intellectual Property Office, the disclosures of which are incorporated by reference herein in their entireties.

BACKGROUND

Example embodiments disclosed herein relate to a server device and a method of operating the same, and more particularly, to a server device which may be stably operated in spite of power loss and a method of operating the same.

As data consumption and a demand for data security increase, it is important to improve a processing capacity or a processing performance of data in a server device. Also, since a capacity and a performance of functional modules or functional blocks for storing data or performing data processing increase, power consumed to operate each module or block is also increased.

SUMMARY

Some example embodiments provide a server device which may be stably operated in spite of power loss and a method of operating the same.

According to an example embodiment of the present invention, there is provided a server device including: a host system; a plurality of memory modules; a backplane configured to transmit main power supplied from the host system to the plurality of memory modules; and at least one replaceable battery module connected to the backplane and configured to supply first auxiliary power to the plurality of memory modules, wherein the plurality of memory modules includes: a volatile memory; a non-volatile memory; and a memory module controller using the first auxiliary power supplied from the at least one replaceable battery module to maintain data of the volatile memory or flush data of the volatile memory to the non-volatile memory, in response to the power loss occurring in the main power.

According to another example embodiment of the present invention, there is provided a server device including: a host system; a backplane including a plurality of solid state drive (SSD) connectors configured to interface the host system to receive main power and receive a signal; a plurality of SSDs configured to receive the main power through an installed SSD connector from among the plurality of SSD connectors; and at least one battery module connected to the backplane, the at least one battery module comprising a first power loss protection (PLP) block, and the at least one battery module configured to supply first auxiliary power to the plurality of SSDs, in response to power loss of the main power reaching a sudden power off (SPO) state.

According to another example embodiment of the present invention, there is provided a method of operating a server device including: supplying of main power to a memory module; monitoring of a power loss of the main power from a power loss protection (PLP) block included in at least one of the memory module and a battery module; and supplying of first auxiliary power generated from the battery module to the memory module, in response to the power loss of the main power being above a first reference value.

BRIEF DESCRIPTION OF THE FIGURES

The above and other features and advantages of the present invention will become more apparent by describing in detail exemplary embodiments thereof with reference to the attached drawings in which.

DETAILED DESCRIPTION

Hereinafter, some example embodiments of the present invention may be described in detail and clearly to such an extent that an ordinary one in the art easily implements the present invention.

Figure 1:
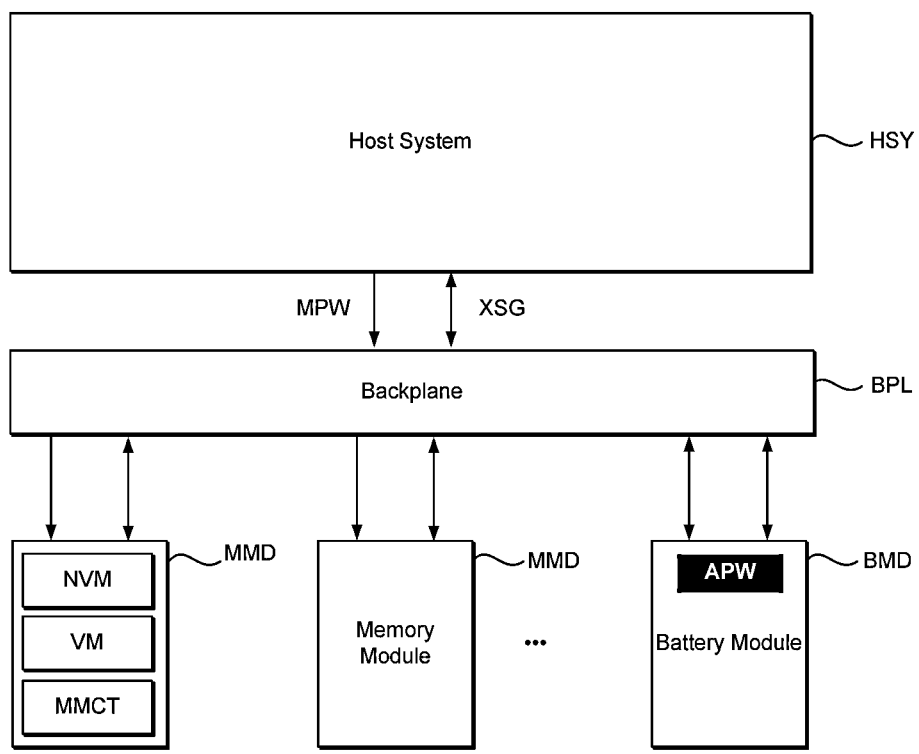
FIG. 1 illustrates a server device according to some example embodiments of the present invention.
Figure 2:
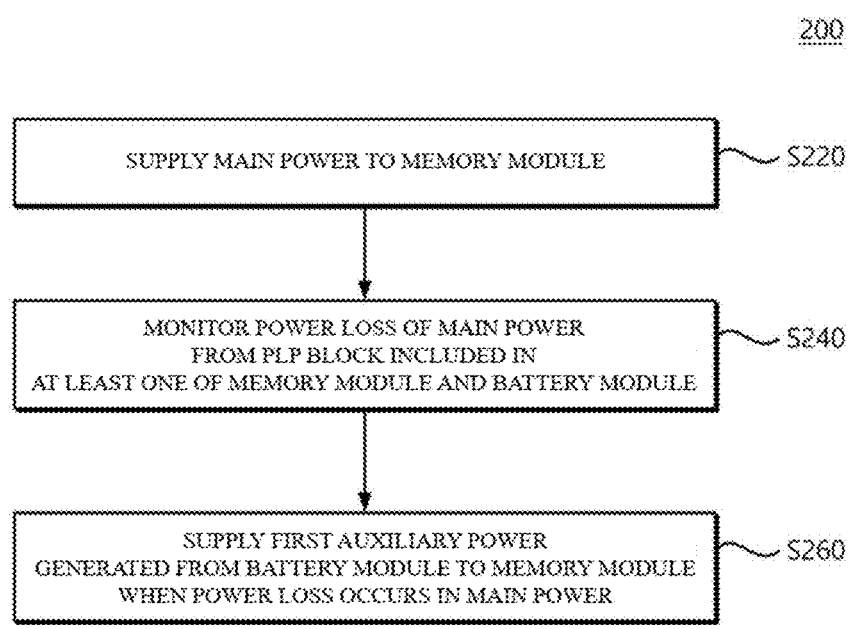
FIG. 2 is a flowchart illustrating a method of operating a server device according to some example embodiments of the present invention.

FIG. 1 illustrates a server device 100 according to some example embodiments of the present invention and FIG. 2 is a flowchart illustrating a method 200 of operating a server device according to some example embodiments of the present invention.

Referring to FIGS. 1 and 2, according to the server device 100 and a method 200 of operating a server device, when main power MPW supplied to a memory module MMD is lost, first auxiliary power APW1 is supplied to the memory module MMD from a battery module BMD and thus, the server device 100 may be stably operated even if the power is lost.

The server device 100 according to some example embodiments of the present invention includes a host system HSY, a backplane BPL, a plurality of memory module connectors CNTs, the memory module MMD, and the battery module BMD in order to be stably operated even if the power is lost. The method 200 of operating a server device according to some example embodiments of the present invention includes supplying of main power to the memory module MMD in operation S220, monitoring of the power loss of the main power in operation S240, and supplying of the first auxiliary power APW1 generated from the battery module BMD to the memory module MMD, when the power loss occurs from the main power, in operation S260, for stable operation in spite of the power loss.

The server device 100 according to some example embodiments of the present invention may be operated according to the method 200 of operating a server device. Also, the method 200 of operating a server device according to some example embodiments of the present invention may be performed in the server device 100. However, the present invention is not limited thereto, the server device 100 may be operated according to other operating method, and the method 200 of operating a server device may be performed in other server device. Hereinafter, for convenience of description, it is described that the server device 100 according to some example embodiments of the present invention is operated according to the method 200 of operating a server device and the method 200 of operating a server device according to some example embodiments of the present invention is performed in the server device.

Referring continuously to FIGS. 1 and 2, the plurality of memory module connectors CNTs is electrically connected to the host system HSY.

FIG. 1 illustrates that a pair of power wiring and signal wiring is respectively connected between the host system HSY and the backplane BPL and between the backplane BPL and each memory module MMD. The main power MPW may be supplied through the power wiring and a signal XSG may be transmitted and received through the signal XSG. The signal XSG may include a signal, data, or a command.

Here, according to the number of main controllers MCTLs included in the host system HSY, the number of the pair of power wiring and signal wiring may vary. For example, when two main controllers MCTLs are included in the host system HSY, two pairs of power wiring and signal wiring may be connected between the host system HSY and the backplane BPL and between the backplane BPL and each memory module connectors CNTs.

The main power MPW is supplied to the memory module MMD from the host system HSY through the backplane BPL in operation S220. The backplane BPL may include the plurality of memory module connectors (not illustrated) where each memory module MMD is installed. The connection between the memory module MMD and the memory module connectors will be described in more detail later.

The memory module MMD may include a non-volatile memory NVM, a volatile memory VM, and a memory module controller MMCT.

The non-volatile memory NVM may include a NAND flash memory, a vertical NAND flash memory, a NOR flash memory, a resistive random access memory, (RRAM), a phase-change random access memory (PRAM), a magneto resistive random access memory (MRAM), a ferroelectric random access memory (FRAM), and a spin transfer torque random access memory (STT-RAM), or a combination thereof.

The volatile memory VM may be used to write data to the non-volatile memory NVM or read data from the non-volatile memory NVM or may be operated as a buffer memory or a cache memory which is used while the main controller MCTL of the host system HSY processes requests. The volatile memory VM may be realized as at least one of a dynamic random access memory (DRAM), a high bandwidth memory (HBM), and a static random access memory (SRAM).

In the memory module controller MMCT, when the power loss occurs with respect to the main power MPW, the first auxiliary power APW1 may be used to maintain data of the volatile memory VM or to flush data of the volatile memory VM to the non-volatile memory NVM. When the power loss occurs in the main power MPW, for example, when the power loss of the main power MPW is above a first reference value, the server device 100 may be operated in an abnormal mode. In the abnormal mode, data of the volatile memory VM may be corrupted or lost.

Accordingly, in the memory module controller MMCT, the first auxiliary power APW1 may be used to maintain data of the volatile memory VM in the abnormal mode. For example, the memory module controller MMCT may perform refresh operations by using the first auxiliary power APW1.

Furthermore, when the power loss with respect to the main power MPW reaches the sudden power off (SPO) state, that is, when the state that the power loss with respect to the main power MPW is above the first reference value maintains for more than first reference time, the memory module controller MMCT may flush data of the volatile memory VM to the non-volatile memory NVM. After the power is restored, the data flushed to the non-volatile memory NVM may be loaded back to the volatile memory VM and an existing operations may be continuously processed. Accordingly, data integrity may be realized in the server device 100 according to some example embodiments of the present invention.

The first auxiliary power APW1 may be supplied from the battery module BMD. At least one battery module BMD may be included in the server device 100, may be connected to the backplane BPL, and may be replaceable.

The backplane BPL may include at least one battery module connector (not illustrated) to which the at least one battery module BMD is installed. Here, the at least one battery module BMD may be installed to the memory module connector to which the memory module MMD may be installed. The backplane BPL including the battery module BMD may be described in more detail later. Since the battery module BMD of the server device 100 according to some example embodiments of the present invention is detachably installed to the backplane BPL, the defective battery module BMD may be rapidly and easily replaced and thus, stability of the server device 100 may be improved.

As described above, various numbers of the memory module MMD and the battery module BMD may be included. Here, the number of the memory module MMD and the battery module BMD included in the server device 100 according to some example embodiments of the present invention may correspond to a memory capacity and a battery capacity required or desired in the server device 100.

For example, when the server device 100 according to some example embodiments of the present invention is a 2U Rack server device requiring or desiring the power of 1.2 KW and 20 memory modules MMDs with petabyte (PB) SSD 2.0 are included, the number of the battery module BMD may be prepared to generate the first auxiliary power APW1 for stably operating a data flushing operation, which will be described later, in 20 memory modules MMDs. In this case, 2 battery modules BMDs each having a capacity of 120 Wh may be included. In addition, the number and the capacity of the battery module BMD may be prepared to maintain data of the memory module MMD for a certain period of time in the server device 100. In the above example, in order to operate a backup operation for one hour by the server device 100, 10 battery modules BMDs each having a capacity of 120 Wh may be included. Here, the number of the memory modules MMDs may vary according to number of slots of drive bays in the server device 100.

When the power loss occurs in the main power MPW supplied to the memory module MMD, the battery module BMD supplies the first auxiliary power APW1 to the memory module MMD in operation S260. Whether the power loss occurs in the main power MPW supplied to the memory module MMD may be monitored by a power loss protection (PLP) block included in the memory module MMD or the battery module BMD in operation S240. The detailed description is as follows.

Figure 3:
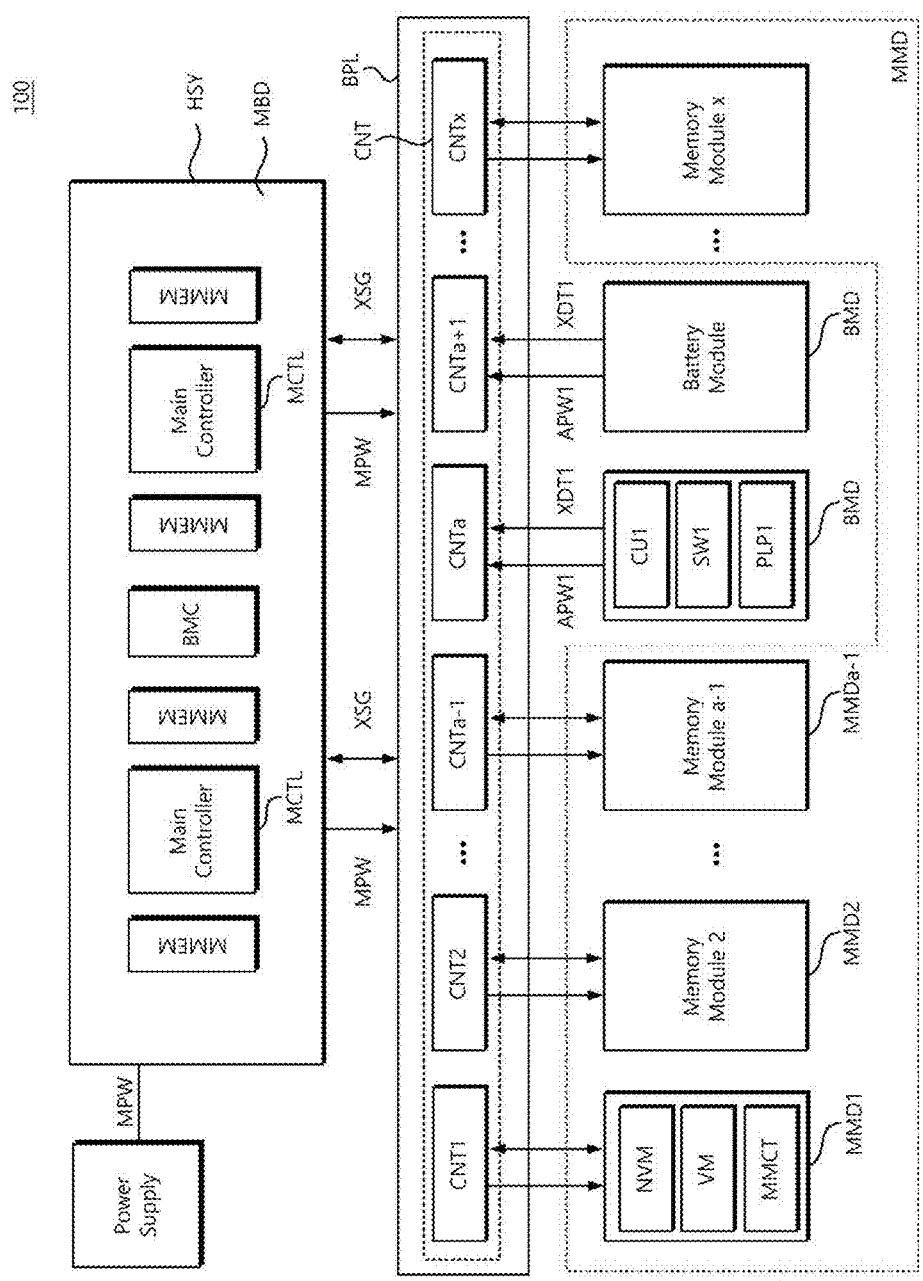
FIG. 3 illustrates a server device including a power loss protection (PLP) block in a battery module according to some example embodiments of the present invention.

FIG. 3 illustrates the server device 100 including the PLP block in the battery module BMD according to some example embodiments of the present invention.

Referring to FIG. 3, the server device 100 according to some example embodiments of the present invention includes the plurality of memory module connectors CNTs, the memory module MMD, and the battery module BMD.

The plurality of memory module connectors CNTs may be included in the backplane BPL.

FIG. 3 illustrates that the host system HSY includes the two main controllers MCTLs, wherein each of (or alternatively, at least one of) the main controllers MCTLs supplies the main power MPW and the signal XSG to the backplane BPL or receives the signal XSG from the backplane BPL through a pair of power wiring and signal wiring. Here, each of (or alternatively, at least one of) the main controllers MCTLs may include two main memories MMEM. However, the present invention is not limited thereto and the number of the main controllers MCTLs and the main memories MMEMs may vary.

Also, the host system HSY according to some example embodiments of the present invention may further include a baseboard management controller (BMC). The baseboard management controller BMC may monitor a physical state of the memory module MMD or the battery module BMD. For example, when the memory module MMD or the battery module BMD transmits a detection signal relating to the power loss of the main power MPW to the host system HSY by using an operation, which will be described later, the corresponding operation may be controlled by the baseboard management controller BMC.

The main controller MCTL and the baseboard management controller BMC are disposed on a main board MBD so that the main power MPW may be applied thereto through a wiring of the main board MBD or the main controller MCTL and the baseboard management controller BMC may transmit and receive the corresponding signal XSG. The host system HSY may receive the main power MPW through a power supply connected using a power cable and transmit the received main power MPW to the backplane BPL.

Each memory module MMD may be connected to the corresponding memory module connector CNT from among the plurality of memory module connectors CNTs. For example, a first memory module MMD1 may be connected to a first memory module connector CNT1 and a second memory module MMD2 may be connected to a second memory module connector CNT2.

According to an interface specification of the memory module MMD, the corresponding memory module connector CNT may vary. For example, when the first memory module MMD1 is a solid state drive (SSD), the first memory module connector CNT1 may support an interface according to a standard of peripheral component interconnect express (PCIe) or non-volatile memory express (NVMe). Also, when the first memory module MMD1 is a compute express link DRAM (CXL DRAM), the first memory module connector CNT1 may support an interface according to the CXL standard.

The memory module MMD according to some example embodiments of the present invention may include n (n is a positive number) non-volatile memories NVM and m (m is a positive number) volatile memories VM.

In the memory module MMD according to some example embodiments of the present invention, the number of the non-volatile memories NVM may be greater than the number of the volatile memories VM. That is, n may be greater than m. For example, the memory module MMD according to some example embodiments of the present invention may be an SSD or a smart SSD. When the memory module MMD according to some example embodiments of the present invention is the smart SSD, field programmable gate arrays (FPGA, not illustrated) which perform an arithmetic operation for data stored in the non-volatile memory NVM or the volatile memory VM may be further included.

Also, in the memory module MMD according to some example embodiments of the present invention, the number of the non-volatile memories NVM may be smaller than the number of the volatile memories VM. That is, n may be smaller than m. For example, the memory module MMD according to some example embodiments of the present invention may be the CXL DRAM. Here, the memory module MMD according to some example embodiments of the present invention may write data processed by the main controller MCTL of the host system HSY to the volatile memory VM of the memory module MMD or read data to be processed by the main controller MCTL of the host system HSY from the volatile memory VM of the memory module MMD through the CXL interface, instead of the main memory MMEM of the host system HSY.

In addition, according to some example embodiments of the present invention, various kinds of the memory module MMD may be included. For example, the memory module MMD according to some example embodiments of the present invention may include the first memory module MMD1 and the second memory module MMD. The first memory module MMD1 may transmit and receive data processed by the main controller MCTL of the host system HSY through the main memory MMEM of the host system HSY. For example, the first memory module MMD1 may be an SSD or a smart SSD. The second memory module MMD2 may transmit and receive data processed by the main controller MCTL of the host system HSY without going through the main memory MMEM of the host system HSY. The second memory module MMD2 may be a CXL DRAM. The memory module MMD according to some example embodiments of the present invention may include corresponding interface ports (for example, a PCIe port and a CXL port) for interfacing with the host system HSY.

In the above examples, the non-volatile memory NVM of the memory module MMD according to some example embodiments of the present invention may be a planer NAND flash memory or a vertical NAND (VNAND) flash memory, and the volatile memory VM may be a DRAM or an HBM. Furthermore, in the memory module MMD according to some example embodiments of the present invention, the number of the non-volatile memory NVM may be the same as the number of the volatile memory VM or the volatile memory VM may not be included.

In FIG. 3, monitoring of whether the power loss of the main power MPW occurs may be performed in the battery module BMD of the server device 100 according to some example embodiments of the present invention.

According to some example embodiments of the present invention, 2 battery modules BMDs are included, and each of (or alternatively, at least one of) which may be connected to an a memory module connector CNTa and an a+1 memory module connector CNTa+1. The main power MPW may be supplied to the battery module BMD through a power pin (not illustrated) of the a memory module connector CNTa and the a+1 memory module connector CNTa+1 and may receive the first auxiliary power APW1 from the battery module BMD. For example, when the a memory module connector CNTa and the a+1 memory module connector CNTa+1 support the PCIe SFF-8639 specification, the main power MPW or the first auxiliary power APW1 may be supplied through a corresponding power pin from among P13 through P15. FIG. 3 does not illustrate a direction of the main power MPW being supplied to the battery module BMD. However, it is clear that the main power MPW is supplied to the battery module BMD through the power pin that is same as or different from the power pin for supplying the first auxiliary power APW1 to the a memory module connector CNTa and the a+1 memory module connector CNTa+1 by the battery module BMD. Hereinafter, it is applied as in the same manner.

Each battery module BMD may vary the memory modules MMDs for supplying the first auxiliary power APW1. For example, one of 2 battery modules BMDs may supply the first auxiliary power APW1 to the first through a−1 memory modules MMD1 through MMDa−1 and the other one may supply the first auxiliary power APW1 to the rest of the memory modules MMDs.

Each battery module BMD may include a first charging circuit CU1, a first PLP block PLP1, and a first switch SW1.

The first charging circuit CU1 may generate the first auxiliary power APW1 and may include a plurality of electrolytic capacitors (not illustrated) which corresponds to the required or desired level of the first auxiliary power APW1.

The first PLP block PLP1 may detect the power loss of the main power MPW and output the detected result as a first detection signal XDT1. The first PLP block PLP1 may detect a voltage level of the main power MPW supplied through the power pin of the memory module connector CNT, to which the battery module BMD is installed, for example, the a memory module connector CNTa or the a+1 memory module connector CNTa+1, and may identify whether the power of the main power MPW is lost.

For example, the first PLP block PLP1 includes a voltage detector (not illustrated) to detect the power loss of the main power MPW or a degree of the loss. For example, the first PLP block PLP1 may be activated, when the main power MPW drops from 5 V to 4 V, and may output the first detection signal XDT1 before the main power MPW drops to a voltage (for example, 2.3 V) at which the NAND flash memory enters into a write protection mode.

The first switch SW1 may connect the first charging circuit CU1 to the memory module connector CNT, to which the battery module BMD is installed, for example, the a memory module connector CNTa or the a+1 memory module connector CNTa+1, in response to the first detection signal XDT1.

Figure 4:
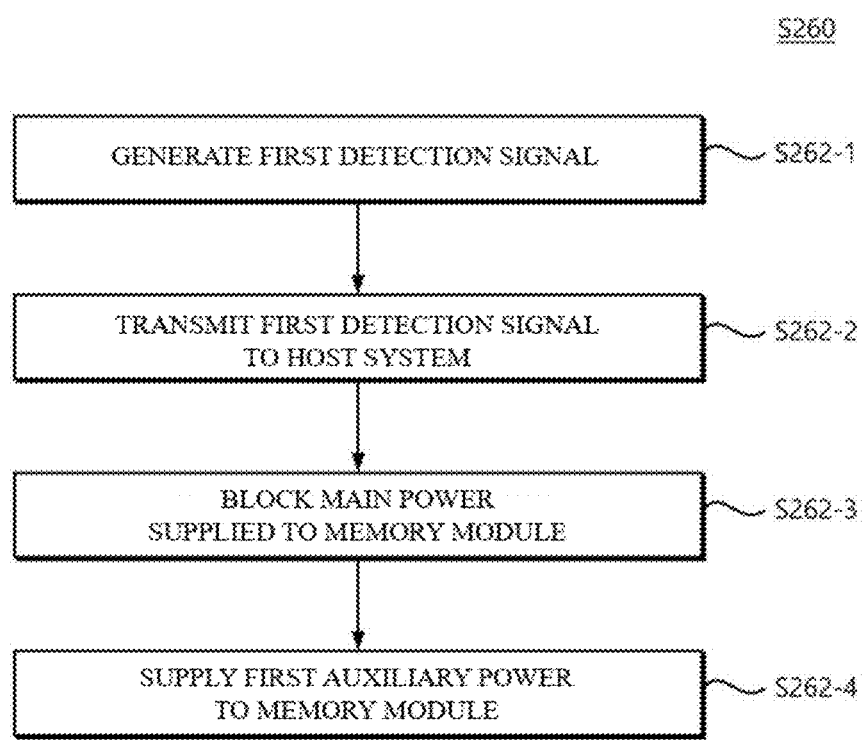
FIG. 4 is a flowchart illustrating a method of supplying a first auxiliary power to a memory module in the server device of FIG. 3.

FIG. 4 is a flowchart illustrating a method of supplying the first auxiliary power APW1 to the memory module MMD in the server device 100 of FIG. 3.

Referring to FIGS. 3 and 4, supplying of the first auxiliary power APW1 to the memory module MMD in operation 260 may include the following steps.

First, the first detection signal XDT1 may be generated by the first PLP block PLP1 in operation S262-1. The first auxiliary power APW1 may be applied to the memory module connector (CNTa or CNTa+1), to which the battery module BMD is connected, by the first switch SW1 which responds to the first detection signal XDT1.

At the same time or sequentially at a certain time interval, the first detection signal XDT1 may be transmitted to the host system HSY in operation S262-2. The first detection signal XDT1 may be transmitted to the host system HSY. The first detection signal XDT1 may be transmitted to the host system HSY through a signal pin of the memory module connector CNT, to which the battery module BMD is installed, for example, the a memory module connector CNTa or the a+1 memory module connector CNTa+1. Also, when system management bus (SMBUS) interface or an inter-integrated circuit (I2C) interface is supported for the battery module BMD according to some example embodiments of the present invention, the first detection signal XDT1 may be transmitted to the host system HSY as a kind of a signal or a command of the corresponding interface standard. The first detection signal XDT1 transmitted to the host system HSY may be processed by the main controller MCTL.

Also, the first detection signal XDT1 transmitted to the host system HSY may be processed by the baseboard management controller BMC. For example, when the first detection signal XDT1 is transmitted to the host system HSY through the SMBUS interface, for example, through a "SMBDATA pin" of the a memory module connector CNTa or the a+1 memory module connector CNTa+1, the first detection signal XDT1 may be directly transmitted to the baseboard management controller BMC. In addition, when the first detection signal XDT1 is transmitted to the host system HSY through the SMBUS interface, the first detection signal XDT1 may be transmitted to the host system HSY as in a form of a command (for example, "SMBCMD").

Here, the first detection signal XDT1 may be transmitted to the host system HSY as the corresponding signal XSG by the backplane BPL through the memory module connector (CNTa or CNTa+1), to which the battery module BMD is installed. A signal generated from the PLP block of the memory module MMD or the battery module BMD, which will be described below, may be transmitted to the host system HSY and processed as the methods described above.

Next, when the first detection signal XDT1 is received, the main controller MCTL or the baseboard management controller BMC may block supplying of the main power MPW to the memory module MMD in operation S262-3.

At the same time or sequentially at a certain time interval, the first auxiliary power APW1 applied to the memory module connector (CNTa or CNTa+1), to which the battery module BMD is installed, may be supplied to the memory module MMD in operation S262-4.

Since the first auxiliary power APW1 applied to the memory module connector (CNTa or CNTa+1), to which the battery module BMD is installed, is transmitted from the backplane BPL to the memory module connector CNT, to which the memory module MMD is installed, the first auxiliary power APW1 generated from the battery module BMD may be supplied to the memory module MMD. However, the present invention is not limited thereto.

Figure 5:
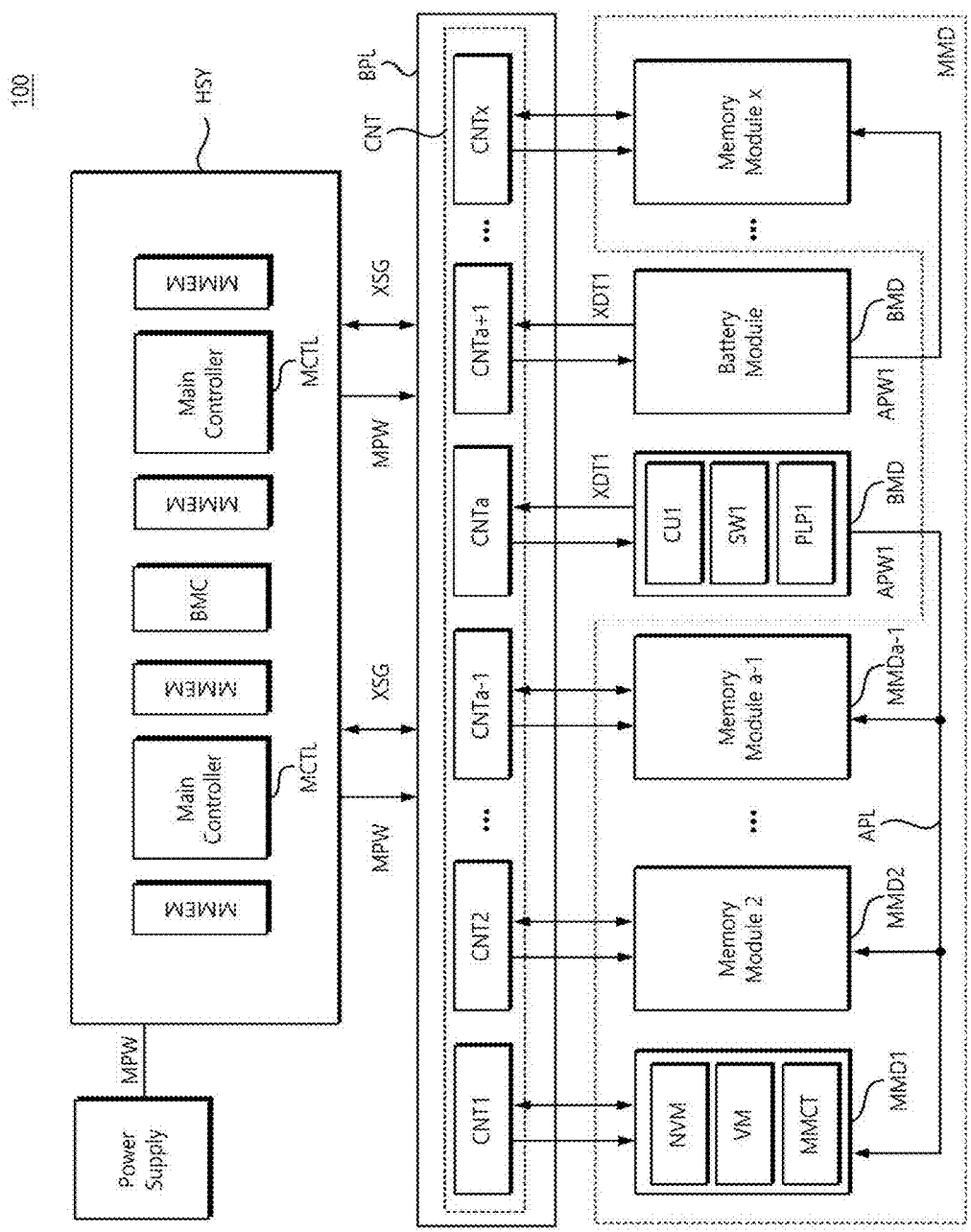
FIG. 5 illustrates a server device further including an auxiliary power line according to some example embodiments of the present invention.

FIG. 5 illustrates the server device 100 further including an auxiliary power line APL according to some example embodiments of the present invention.

Referring to FIG. 5, the server device 100 according to some example embodiments of the present invention may further include the auxiliary power line APL. The auxiliary power line APL is connected between the battery module BMD and the memory module MMD and thus, the first auxiliary power APW1 may be directly supplied to the memory module MMD without passing through the backplane BPL.

Here, the first switch SW1 may connect the first charging circuit CU1 to the auxiliary power line APL, in response to the first detection signal XDT1. Accordingly, the server device 100 according to some example embodiments of the present invention may rapidly apply the first auxiliary power APW1 to the memory module MMD even if the power loss occurs.

Figure 6:
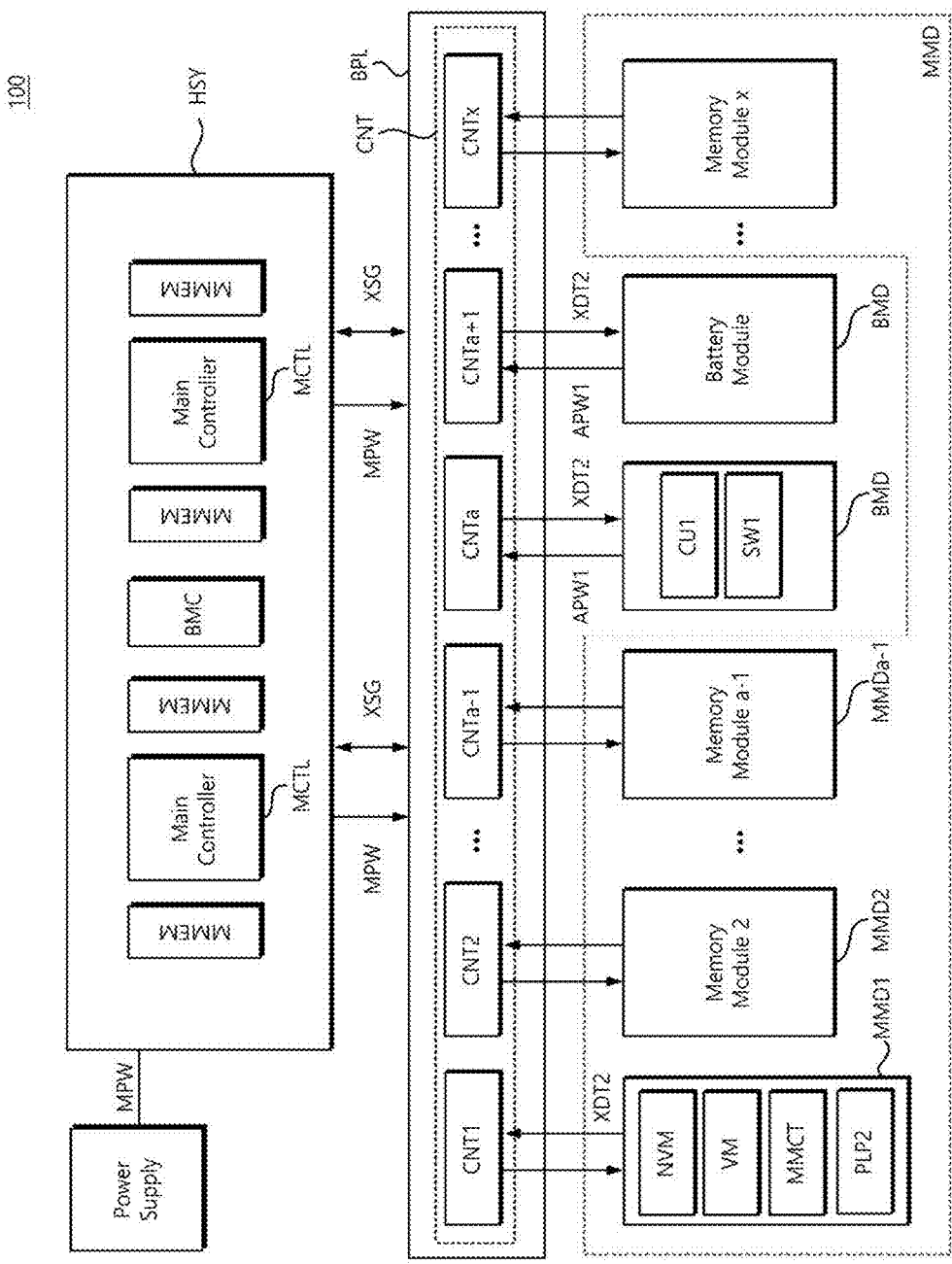
FIG. 6 illustrates a server device including a PLP block in a memory module according to some example embodiments of the present invention.

FIG. 6 illustrates the server device 100 including the PLP block in the memory module MMD according to some example embodiments of the present invention.

Referring to FIG. 6, the memory module MMD of the server device 100 according to some example embodiments of the present invention may include a second PLP block PLP2 along with the non-volatile memory NVM, the volatile memory VM, and the memory module controller MMCT. The second PLP block PLP2 may detect the power loss of the main power MPW and output the detected result as a second detection signal XDT2.

The structure and operation of the second PLP block PLP2 may be the same as those of the first PLP block PLP1 described above. That is, the second PLP block PLP2 may detect a voltage level of the main power MPW supplied through the power pin of the memory module connector CNT, to which the memory module MMD is installed, and may identify whether the power of the main power MPW is lost. For example, the second PLP block PLP2 includes a voltage detector (not illustrated) to detect the power loss of the main power MPW or a degree of the loss. For example, the second PLP block PLP2 may be activated, when the main power MPW drops from 5 V to 4 V, and may output the second detection signal XDT2 before the main power MPW drops to a voltage (for example, 2.3 V) at which the NAND flash memory enters into a write protection mode.

Here, the second PLP block PLP2 detects the power loss of the main power MPW based on an actual voltage level of the main power MPW applied to the memory module MMD and thus, more accurate detection may be performed.

Also, the memory module MMD may be each controlled for the power loss of the main power MPW. For example, when the power loss of the main power MPW does not occur in the first memory module MMD1 and the power loss of the main power MPW occurs only in the second memory module MMD2, the first memory module MMD1 may be normally operated, and an operation corresponding to the abnormal mode may be performed only in the second memory module MMD2 in such a way that data of the volatile memory VM maintains by using the first auxiliary power APW1 or data of the volatile memory VM flushes to the non-volatile memory NVM. Accordingly, resource waste may be prevented or reduced in such a way that required or desired operations are performed in the memory module where the power loss of the main power MPW does not occur.

The second detection signal XDT2 may be transmitted to the host system HSY similarly to the first detection signal XDT1 of FIG. 3. Here, the second detection signal XDT2 may be transmitted to the host system HSY in the same manner as in the first detection signal XDT1 described above. For example, the second detection signal XDT2 may be transmitted to the main controller MCTL or the baseboard management controller BMC of the host system HSY as in a form of signal or a command.

The main controller MCTL or the baseboard management controller BMC of the host system HSY may block the main power MPW with respect to the memory module MMD, in response to the second detection signal XDT2.

The battery module BMD of FIG. 6 may include first charging circuit CU1 and the first switch SW1 and may not include the PLP block. In this case, the second detection signal XDT2 may be transmitted to the battery module BMD.

The second detection signal XDT2 may be transmitted to the battery module BMD through the memory module connector CNT of the backplane BPL. The first switch SW1 of the battery module BMD may electrically connect the first charging circuit CU1 to the memory module connector (CNTa or CNTa+1), to which the battery module BMD is connected, in response to the second detection signal XDT2. Accordingly, the first auxiliary power APW1 of the battery module BMD may be transmitted to the memory module MMD. Here, the first auxiliary power APW1 may be transmitted to all memory modules MMDs or the memory module only which generates the second detection signal XDT2 according to control by the backplane BPL. In this case, the first auxiliary power APW1 may be transmitted to the second memory module MMD2 only.

The second detection signal XDT2 may be transmitted to the battery module BMD using other method. For example, the second detection signal XDT2 is transmitted to the host system HSY and then, is transmitted back to battery module BMD by the main controller MCTL of the host system HSY. However, the present invention is not limited thereto.

Figure 7:
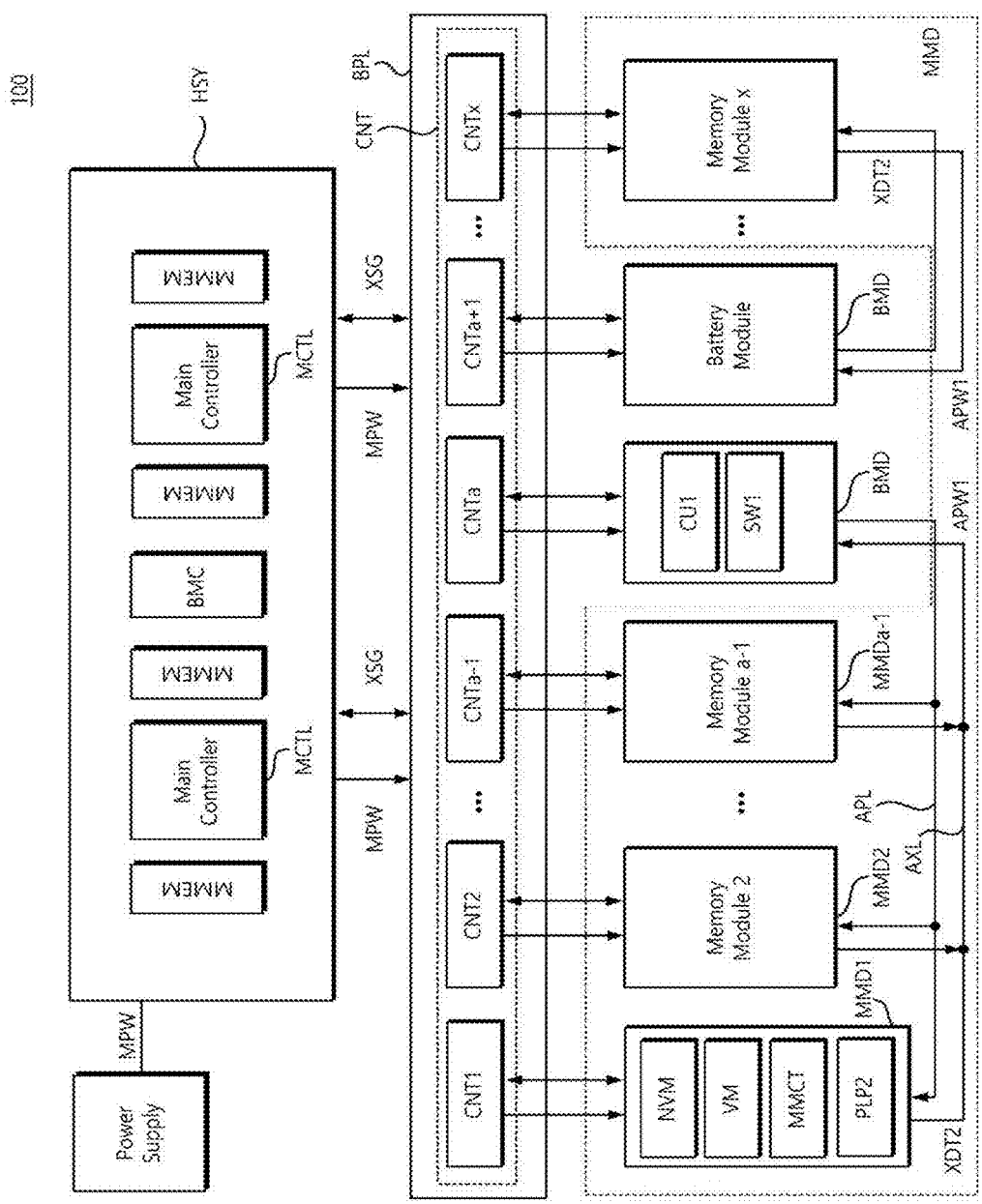
FIG. 7 illustrates a server device further including an auxiliary power line according to some example embodiments of the present invention.

FIG. 7 illustrates the server device 100 further including the auxiliary power line APL according to some example embodiments of the present invention.

Referring to FIG. 7, the server device 100 according to some example embodiments of the present invention may further include the auxiliary power line APL, as in FIG. 5. The auxiliary power line APL is connected between the battery module BMD and the memory module MMD and thus, the first auxiliary power APW1 may be directly supplied to the memory module MMD without passing through the backplane BPL.

The first switch SW1 may connect the first charging circuit CU1 to the auxiliary power line APL, in response to the second detection signal XDT2. Accordingly, the first auxiliary power APW1 may be transmitted to the memory module MMD which generates the second detection signal XDT2. The second detection signal XDT2 may be transmitted to the battery module BMD through an auxiliary signal line AXL. However, the present invention is not limited thereto, and the second detection signal XDT2 may be transmitted to the battery module BMD through the auxiliary power line APL, when the server device 100 of FIG. 7 does not include the separate auxiliary signal line AXL. As described above, the memory module MMD may be each controlled for the power loss of the main power MPW and thus, the number of the first switches SW1 may correspond to the number of the memory modules MMD.

Accordingly, the server device 100 of FIG. 7 may rapidly and accurately respond to the power loss of the main power MPW. Also, as the second detection signal XDT2 is directly transmitted to the battery module BMD without passing through the host system HSY, unnecessary waste of resources may be prevented or reduced.

Figure 8:
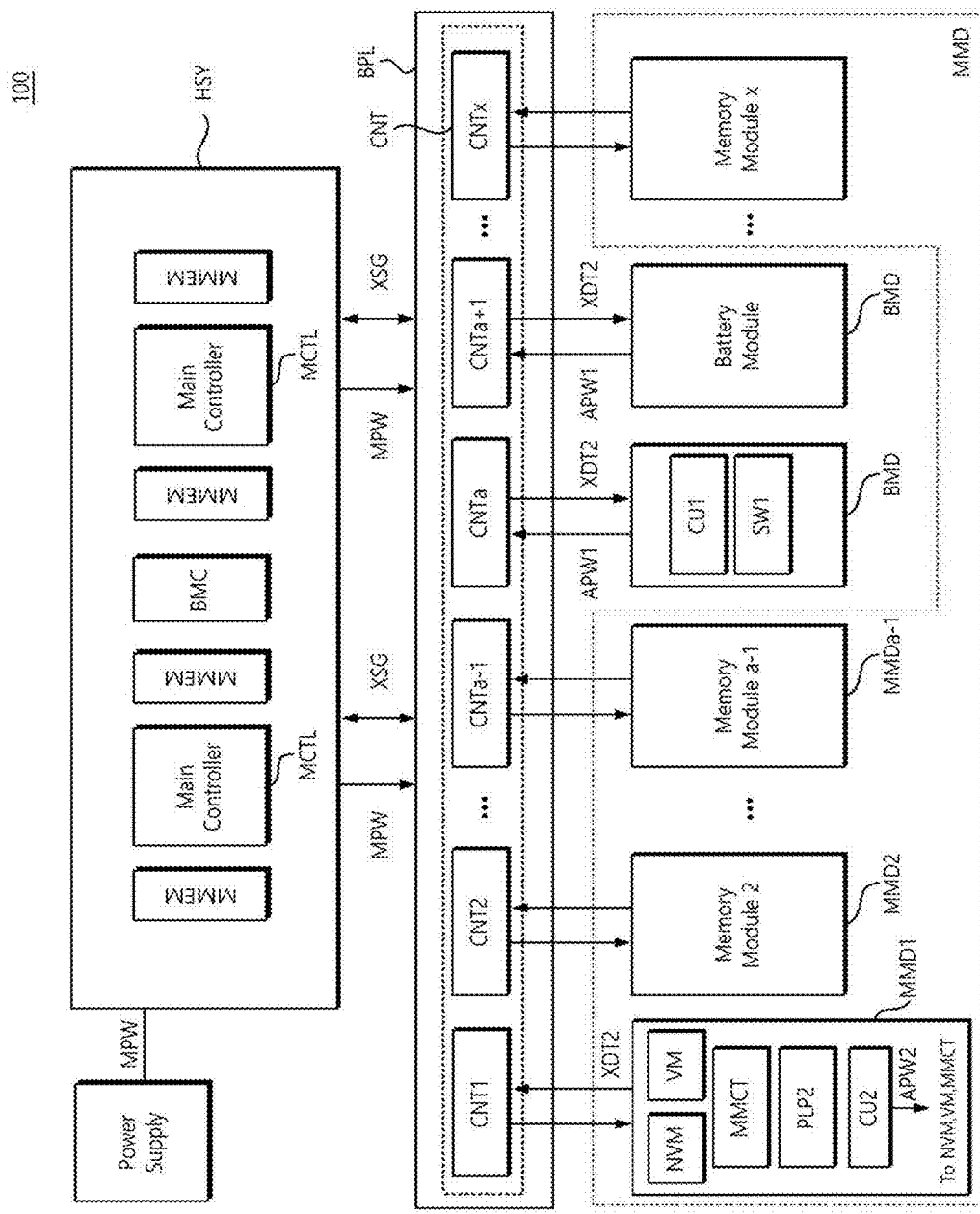
FIG. 8 illustrates a server device where a second auxiliary power is generated from a memory module according to some example embodiments of the present invention.

FIG. 8 illustrates the server device 100 where a second auxiliary power APW2 is generated from the memory module MMD according to some example embodiments of the present invention.

Referring to FIG. 8, the memory module MMD of the server device 100 according to some example embodiments of the present invention may include the second PLP block PLP2 to detect the power loss of the main power MPW in the memory module MMD as in FIG. 6. In addition, the memory module MMD of FIG. 8 may further include a second charging circuit CU2 which generates the second auxiliary power APW2, in response to the second detection signal XDT2 generated from the second PLP block PLP2.

The second charging circuit CU2 may include, for example, a polymer tantalum capacitor. The second auxiliary power APW2 generated by the second charging circuit CU2 may be supplied to each component of the memory module MMD, that is, the non-volatile memory NVM, the volatile memory VM, and the memory module controller MMCT.

In the memory module controller MMCT, when the power loss occurs in the main power MPW, that is, when the second detection signal XDT2 is generated, the second auxiliary power APW2 may be used to maintain data of the volatile memory VM or to flush data of the volatile memory VM to the non-volatile memory NVM. Also, in the memory module MMD according to some example embodiments of the present invention, data of the volatile memory VM may be maintained by the second PLP block PLP2 or data of the volatile memory VM may be flushed to the non-volatile memory NVM. In this case, the second PLP block PLP2 may simultaneously detect the power loss of the main power MPW and take the corresponding actions so that data of the volatile memory VM may be stably protected.

Figure 9:
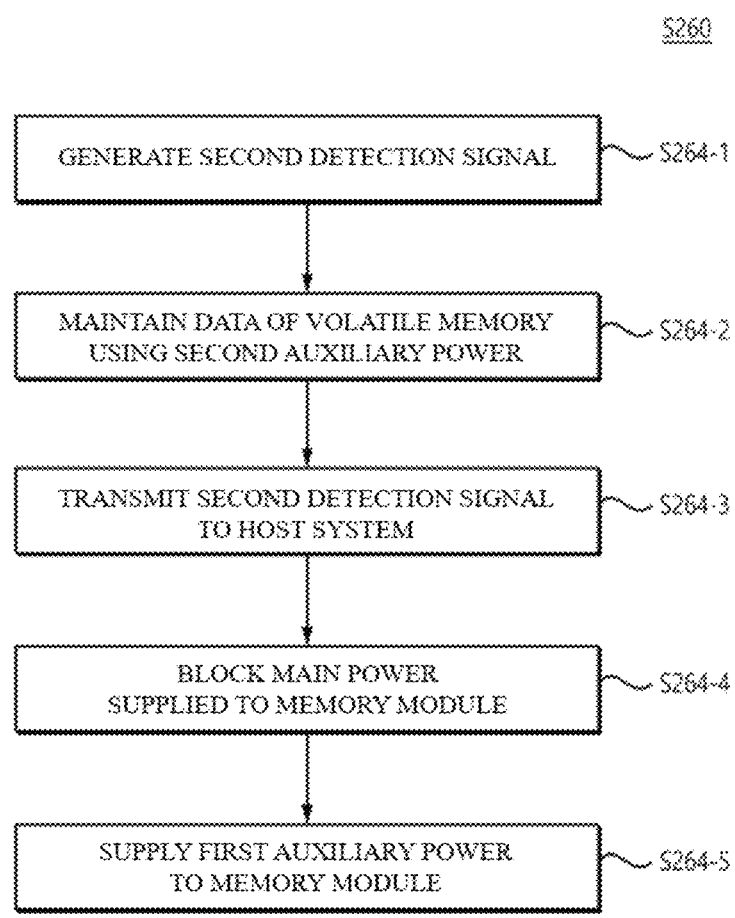
FIG. 9 is a flowchart illustrating a method of supplying a first auxiliary power to a memory module in the server device of FIG. 8.

FIG. 9 is a flowchart illustrating a method of supplying the first auxiliary power APW1 to the memory module MMD in the server device 100 of FIG. 8.

Referring to FIGS. 8 and 9, supplying of the first auxiliary power APW1 to the memory module MMD in operation 260 may include the following steps.

First, the second detection signal XDT2 may be generated by the second PLP block PLP2 in operation S264-1. In response to the second detection signal XDT2, data of the volatile memory VM may be maintained by the second auxiliary power APW2 which is generated from the second charging circuit CU2 in operation S264-2. Maintaining of data of the volatile memory VM by using the second auxiliary power APW2 may be controlled by the memory module controller MMCT or the second PLP block PLP2.

At the same time or sequentially at a certain time interval, the second detection signal XDT2 may be transmitted to the host system HSY in operation S264-3. As in the first detection signal XDT1, the second detection signal XDT2 may be transmitted to the host system HSY through the signal pin of the memory module connector CNT, to which the memory module MMD is installed. For example, the second detection signal XDT2 may be transmitted to the main controller MCTL of the host system HSY. Also, when SMBUS or an I2C is supported for the memory module MMD according to some example embodiments of the present invention, the second detection signal XDT2 may be transmitted to the host system HSY as a kind of a signal or a command of the corresponding interface standard.

The second detection signal XDT2 may be transmitted to the battery module BMD. As described above, the second detection signal XDT2 may be transmitted to the battery module BMD through the backplane BPL, the auxiliary power line APL of FIG. 7, or the auxiliary signal line AXL. In addition, the second detection signal XDT2 is transmitted to the host system HSY and then, is transmitted back to battery module BMD by the baseboard management controller BMC of the host system HSY Next, when the second detection signal XDT2 is received, the main controller MCTL or the baseboard management controller BMC may block supplying of the main power MPW to the memory module MMD in operation S264-4. Here, supplying of the main power MPW is only blocked for the memory module MMD which generates the second detection signal XDT2 and thus, optimized or improved operations of each memory module MMD may be performed.

At the same time or sequentially at a certain time interval, the first auxiliary power APW1 may be transmitted to the memory module MMD from the battery module BMD in operation S264-5. Similarly, the first auxiliary power APW1 may be supplied only to the memory module MMD which generates the second detection signal XDT2. The first auxiliary power APW1 may be applied to the corresponding memory module MMD through the backplane BPL or the auxiliary power line APL of FIG. 7.

The memory module controller MMCT or the second PLP block PLP2 may use the first auxiliary power APW1 to flush data of the volatile memory VM to the non-volatile memory NVM.

In this regard, the server device 100 according to some example embodiments of the present invention uses both first auxiliary power APW1 and second auxiliary power APW2 to respond to the power loss of the main power MPW. Thus, as the memory modules MMDs have increasingly high performance and even if the power required or desired to operate the memory modules MMDs increases, the server device 100 may be stably operated while the power is lost, such as SPO.

Figure 10:
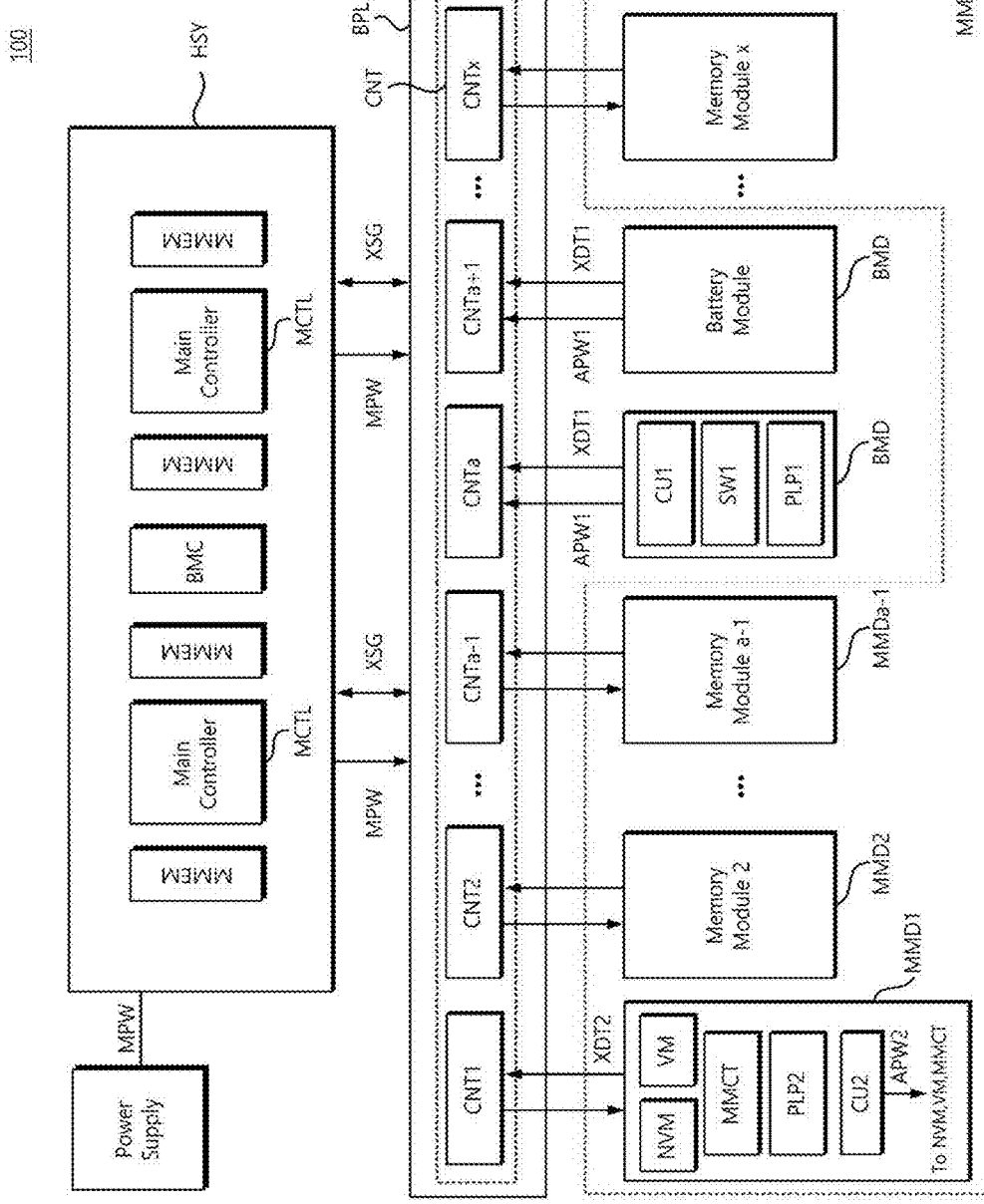
FIG. 10 illustrates a server device respectively including a PLP block in a memory module and a battery module according to some example embodiments of the present invention.

FIG. 10 illustrates the server device 100 respectively including the PLP blocks in the memory module MMD and the battery module BMD according to some example embodiments of the present invention.

Referring to FIG. 10, in the server device 100 according to some example embodiments of the present invention, the battery module BMD may include the first PLP block PLP1 and the memory module MMD may include second PLP block PLP2. That is, the memory module MMD and the battery module BMD may each detect the power loss of the main power MPW. Accordingly, the server device 100 according to some example embodiments of the present invention may accurately detect the power loss of the main power MPW.

Here, a condition of generating the first detection signal XDT1 from the first PLP block PLP1 and a condition of generating the second detection signal XDT2 from the second PLP block PLP2 may be different from each other. For example, the first detection signal XDT1 may be generated when the power loss of the main power MPW is less, compared with the second detection signal XDT2. For example, as described above, it may be set in the second PLP block PLP2 to generate the second detection signal XDT2 when the main power MPW drops to about 2.3 V, whereas it may be set in the first PLP block PLP1 to generate the first detection signal XDT1 when the main power MPW drops to a voltage (for example, 2.9 V) higher than 2.3 V.

Figure 11:
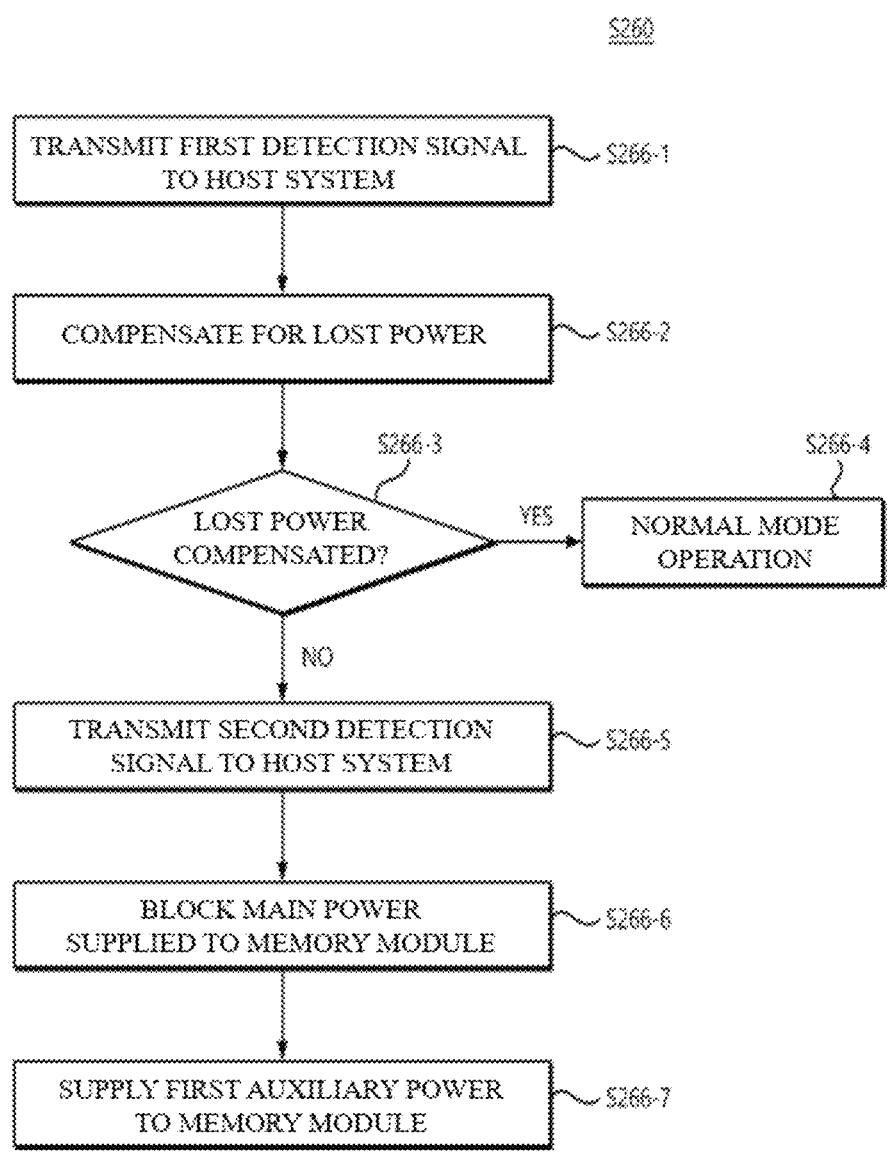
FIG. 11 is a flowchart illustrating a method of supplying a first auxiliary power to a memory module in the server device of FIG. 10.

FIG. 11 is a flowchart illustrating a method of supplying the first auxiliary power APW1 to the memory module MMD in the server device 100 of FIG. 10.

Referring to FIGS. 10 and 11, supplying of the first auxiliary power APW1 to the memory module MMD in operation 260 may include the following steps.

First, when the main power MPW drops to a first voltage, the first detection signal XDT1 may be generated by the first PLP block PLP1 and transmitted to the host system HSY in operation S266-1. For example, when the first detection signal XDT1 is received, the baseboard management controller BMC of the host system HSY performs a boosting operation for the main power MPW to compensate for the lost power in operation S266-2. In this regard, the host system HSY may further include a boosting circuit (not illustrated).

When the lost power of the main power MPW is compensated above the first voltage through the boosting operation for the main power MPW (if "YES" in operation S266-3), the server device 100 may be operated in a normal mode until the first detection signal XDT1 is transmitted again to the host system HSY in operation S266-4. Although the boosting operation is performed for the main power MPW and when the main power MPW drops to a second voltage which is lower than the first voltage (if "NO" in operation S266-3), the second detection signal XDT2 may be generated by the second PLP block PLP2 and transmitted to the host system HSY in operation S266-5.

For example, when the second detection signal XDT2 is received, the main controller MCTL of the host system HSY supplies the first auxiliary power APW1 to the memory module MMD to perform the corresponding operation in the abnormal mode described above. More specifically, the main controller MCTL of the host system HSY may block supply of the main power MPW to the memory module MMD in operation S266-6 and control the first auxiliary power APW1 to be supplied to the memory module MMD from the battery module BMD in operation S266-7.

Therefore, in the server device 100 according to some example embodiments of the present invention, a flushing operation is minimized in the memory module MMD and thus, unnecessary delay or power consumption may be prevented or reduced.

Figure 12:
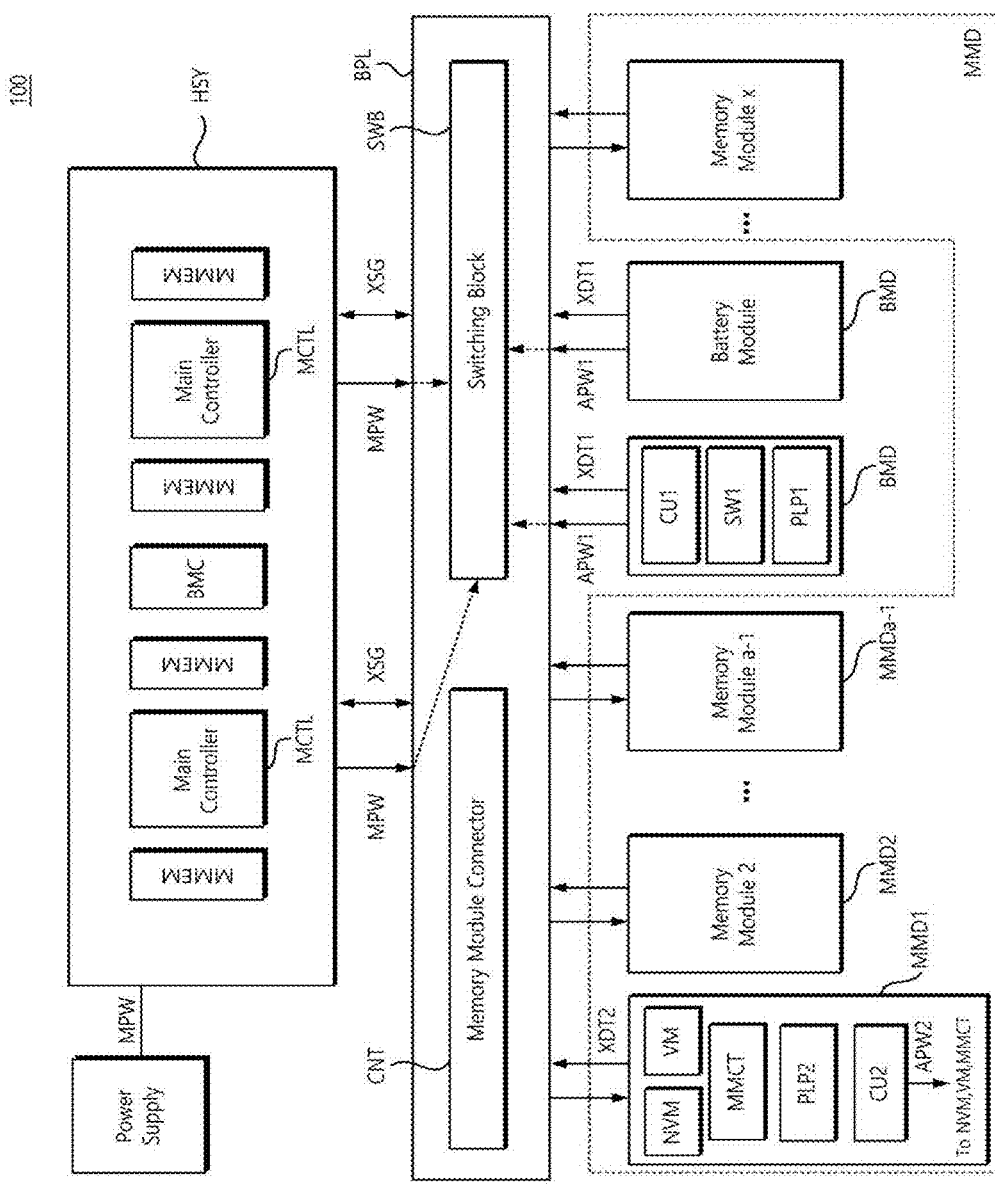
FIG. 12 illustrates a server device further including a switching block according to some example embodiments of the present invention.

FIG. 12 illustrates the server device 100 further including a switching block SWB according to some example embodiments of the present invention.

Referring to FIG. 12, the server device 100 according to some example embodiments of the present invention may further include the switching block SWB. The switching block SWB may supply one of the main power MPW and the first auxiliary power APW1 to the memory module MMD, in response to the first detection signal XDT1 generated from the battery module BMD or the second detection signal XDT2 generated from the memory module MMD. When the main controller MCTL of the host system HSY is to block supply of the main power MPW to the memory module MMD and to apply the first auxiliary power APW1 to the memory module MMD as described above, the switching block SWB may be used.

Here, the main controller MCTL of the host system HSY may intactly transmit the first detection signal XDT1 or the second detection signal XDT2 to the switching block SWB or transmit a control signal (not illustrated), which corresponds to the first detection signal XDT1 or the second detection signal XDT2, to the switching block SWB. The switching block SWB may be disposed on the backplane BPL.

Since the server device 100 according to some example embodiments of the present invention includes the switching block SWB, a voltage above standard may be prevented or reduced from being applied to the memory module MMD or the first auxiliary power APW1 may be prevented or reduced from being applied to the host system HSY. Accordingly, stability of the server device 100 may be improved.

Figure 13:
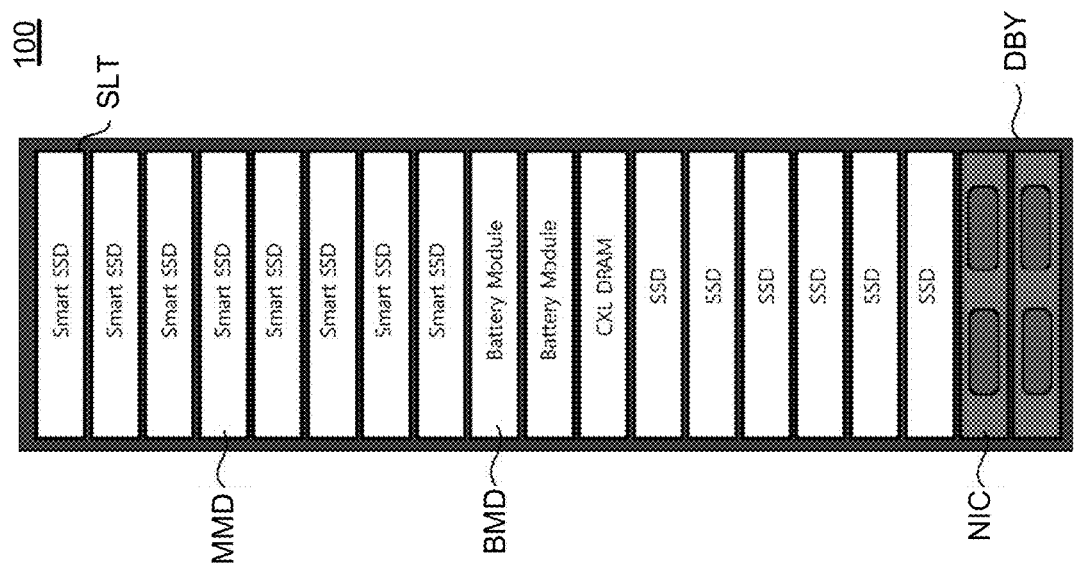
FIG. 13 illustrates a side of a server device according to some example embodiments of the present invention.

FIG. 13 illustrates a side of the server device 100 according to some example embodiments of the present invention.

Referring to FIG. 13, the server device 100 according to some example embodiments of the present invention may include the plurality of memory modules MMDs, two battery modules BMDs, and two network interface cards (NICs) in a plurality of slots SLTs included in a drive bay DBY disposed at one side of a server case (not illustrated). Here, the plurality of memory modules MMDs may include eight smart SSDs, one CXL DRAM, and SSDs. However, the present invention is not limited thereto. The number of the memory modules MMDs and the battery modules BMDs included in the drive bay DBY of the server device 100 according to some example embodiments of the present invention may vary and various kinds of the memory modules MMDs may be included.

The server device 100 according to some example embodiments of the present invention has the structure that the battery modules BMDs may be installed to the slots, similar to the memory modules MMD, as described above so as to facilitate the use thereof. Accordingly, although there are defects generated in the battery modules BMDs, the battery modules BMDs may be easily and rapidly replaced and thus, stability of the server device 100 may be improved.

Here, the server device 100 according to some example embodiments of the present invention may rapidly identify defects of the battery module BMD as described below.

Figure 14:
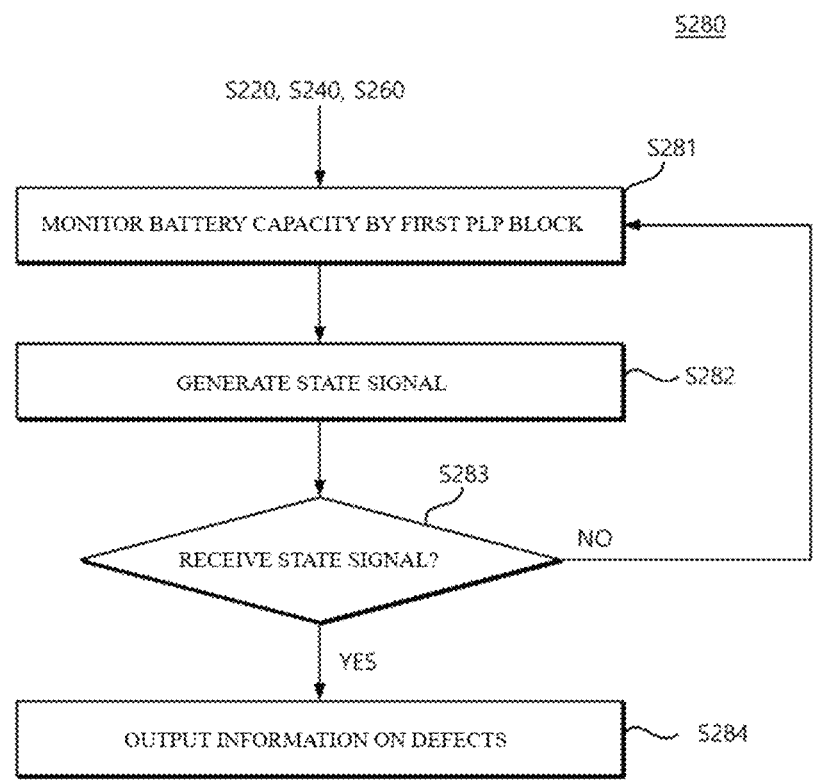
FIG. 14 is a flowchart illustrating detecting of defects in a battery module according to some example embodiments of the present invention.

FIG. 14 is a flowchart illustrating detecting of defects in the battery module BMD according to some example embodiments of the present invention.

Referring to FIGS. 2, 3, and 14, the method 200 of operating a server device according to some example embodiments of the present invention may include at least one from among supplying of the main power MPW to the memory module MMD in operation S220, monitoring of the power loss of the main power MPW in operation S240, and supplying of the first auxiliary power APW1 to the memory module MMD in operation S260 and may further include detecting of defects in the battery module BMD in operation S280, performed at the same time or sequentially at a certain time interval.

For example, detecting of defects in the battery module BMD in operation S280 may include monitoring the battery capacity of the corresponding battery module BMD by the first PLP block PLP1 of the battery module BMD in operation S281. For example, the first PLP block PLP1 described above may monitor the battery capacity, as in the same manner as in detecting of the power loss of the main power MPW. For example, the first PLP block PLP1 may include the voltage detector VDT to perform monitoring in such a way that the battery capacity of the first charging circuit CU1 is compared to the preset or desired battery capacity of the corresponding battery module BMD.

When the battery capacity of the first charging circuit CU1 is smaller than the preset or desired battery capacity of the corresponding battery module BMD, the first PLP block PLP1 may generate a state signal in operation S282.

The state signal may be transmitted to the host system HSY by using a method that is same as that of the first detection signal XDT1. For example, the state signal may be transmitted to the host system HSY through a signal pin in the PCIe standard of the memory module connector (CNTa or CNTa+1), to which the battery module BMD is installed, or through a signal pin in the SMBUS standard of the memory module connector (CNTa or CNTa+1). For example, the state signal may be transmitted to the host system HSY as the corresponding signal XSG by the backplane BPL through the memory module connector (CNTa or CNTa+1), to which the battery module BMD is installed. Here, the state signal may be transmitted to the host system HSY in the form of a command.

The state signal may be processed by the main controller MCTL of the host system HSY. In addition, when the state signal is transmitted to the host system HSY through a SMBUS interface, the state signal may be processed by the baseboard management controller BMC of the host system HSY.

When the main controller MCTL or the baseboard management controller BMC of the host system HSY receives the state signal (if "YES" in operation S283), the main controller MCTL or the baseboard management controller BMC may output defects of the corresponding battery module BMD in operation S284. For example, information about defects of the battery module BMD may be output as a display or an alarm. On the other hands, when the main controller MCTL or the baseboard management controller BMC of the host system HSY does not receive the state signal (if "NO" in operation S283), monitoring the battery capacity of the battery module BMD may be continuously performed in operation S281.

As described above, in the server device 100 according to some example embodiments of the present invention, defects such as lack of battery capacity may be rapidly identified by the PLP block of the battery module BMD and thus, stability of the server device 100 may be improved.

Figure 15:
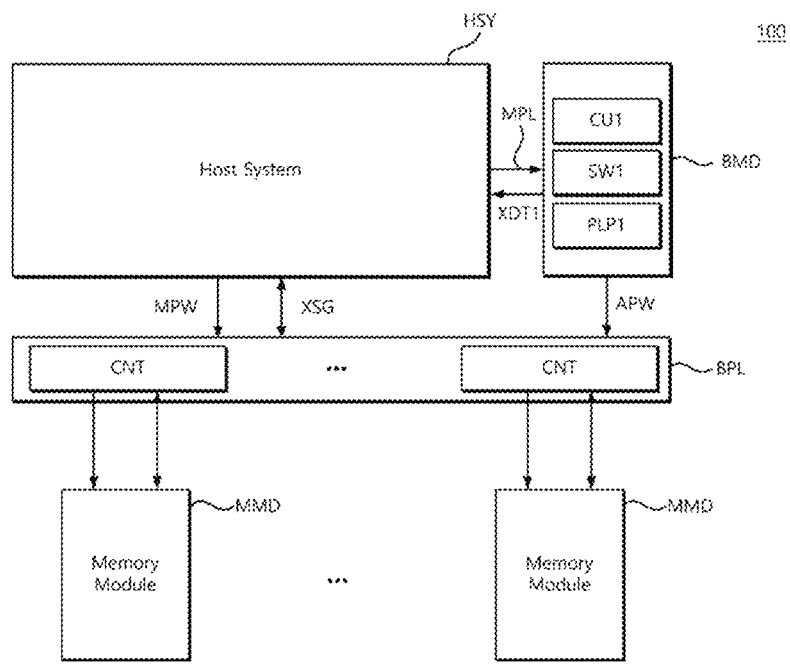
FIGS. 15 and 16 respectively illustrate a server device including a battery module connected to a main power line according to some example embodiments of the present invention.
Figure 16:
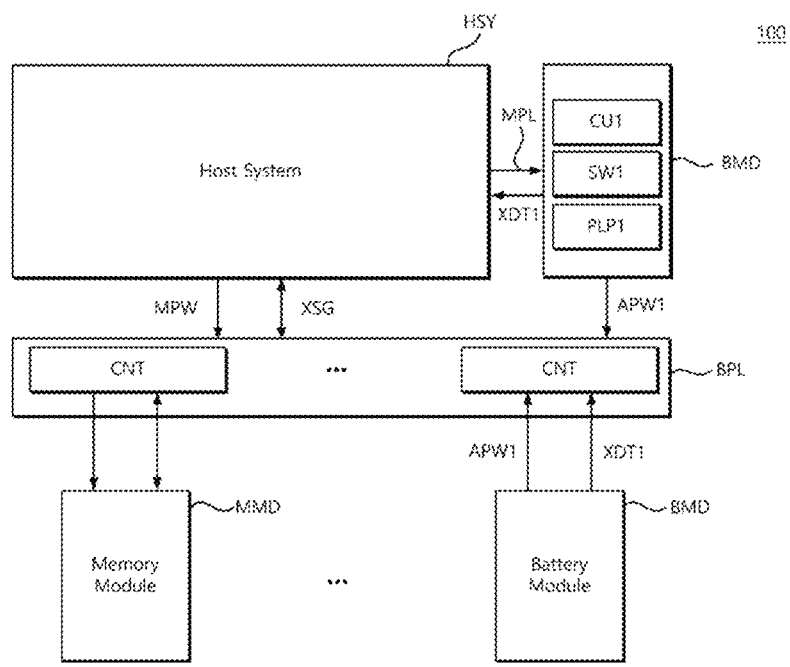

FIGS. 15 and 16 respectively illustrate the server device 100 including the battery module BMD connected to a main power line MPL according to some example embodiments of the present invention.

First, referring to FIG. 15, the battery module BMD of the server device 100 according to some example embodiments of the present invention may be connected to the host system HSY through the main power line MPL. The main power MPW may be supplied from the host system HSY to the battery module BMD through the main power line MPL. Also, the first auxiliary power APW1 generated by the battery module BMD may be transmitted to the backplane BPL and may be supplied to all memory modules MMDs or the corresponding memory module MMD.

For example, the battery module BMD may include the first PLP block PLP1, the first charging circuit CU1, and the first switch SW1. The first PLP block PLP1 may detect the power loss of the main power MPW supplied from the host system HSY by using the method described above or a similar method to generate the first detection signal XDT1. When the first detection signal XDT1 is generated, the first switch SW1 may supply the first auxiliary power APW1 generated from the first charging circuit CU1 to the backplane BPL, in response to the first detection signal XDT1. In this regard, the first auxiliary power APW1 may be supplied to the plurality of memory modules MMDs.

As described above, in the server device 100 according to some example embodiments of the present invention, the main power MPW directly supplied from the host system HSY is used to accurately identify the power loss and to take the corresponding actions.

Next, referring to FIG. 16, in the server device 100 according to some example embodiments of the present invention, some of battery modules BMDs are connected to the host system HSY through the main power line MPL and the rest of the battery modules BMDs are connected to the memory module connectors CNTs. Accordingly, stability of the server device 100 may be improved when resources are not limited a lot.

According to the server device and the method of operating the same, a battery module is included to supplement the lost power. Accordingly, although the power is lost while the server device is operated, the server device may be stably operated.

Any of the elements and/or functional blocks disclosed above may include or be implemented in processing circuitry such as hardware including logic circuits; a hardware/software combination such as a processor executing software; or a combination thereof. For example, the main controller MCTL, memory module controller MMCT, and power loss prevention (PLP) blocks PLP1, PLP2 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A server device comprising: a backplane including a plurality of memory module connectors; a host system configured to supply a main power to the backplane; a plurality of memory modules each connected to a respective one of the plurality of memory module connectors, the plurality of memory modules configured to receive the main power supplied from the host system via the backplane, the plurality of memory modules including, a volatile memory, a non-volatile memory, and a memory module controller including processing circuitry configured to use a first auxiliary power to maintain data of the volatile memory or flush data of the volatile memory to the non-volatile memory, in response to power loss occurring in the main power; and at least one replaceable battery module connected to the backplane via at least one of the memory module connectors, the at least one replacement battery module including, a first charging circuit configured to generate the first auxiliary power, a first power loss protection (PLP) block including processing circuitry configured to detect the power loss of the main power provided by the host system, and a first switch configured to connect the first charging circuit to the backplane via the at least one of the memory module connectors to supply the first auxiliary power to the plurality of memory modules, in response to the first PLP block detecting the power loss of the main power from the host system and configured to supply first auxiliary power to the plurality of memory modules.

2. The server device of claim 1, wherein
the first PLP block is configured to output a first detection signal based on the detected power loss of the main power.

3. The server device of claim 2, wherein the plurality of memory modules further comprises:
a second PLP block including processing circuitry configured to detect the power loss of the main power and output a second detection signal based on the detected power loss of the main power; and
a second charging circuit configured to generate second auxiliary power, in response to the second detection signal,
wherein the memory module controller is further configured to use at least one of the first auxiliary power and the second auxiliary power to maintain data of the volatile memory or flush data of the volatile memory to the non-volatile memory.

4. The server device of claim 1, wherein
the plurality of memory modules further comprises a second PLP block configured to detect the power loss of the main power and output a second detection signal based on the detected power loss of the main power, and
the host system is configured to block supplying of the main power to a memory module which outputs the second detection signal from among the plurality of memory modules, in response to the second detection signal.

5. The server device of claim 4, wherein
the plurality of memory modules further comprises a second charging circuit configured to further supply a second auxiliary power to the volatile memory, the non-volatile memory, and the memory module controller, in response to the second detection signal, and
the memory module controller uses at least one of the first auxiliary power and the second auxiliary power to maintain data of the volatile memory or flush data of the volatile memory to the non-volatile memory.

6. The server device of claim 1, wherein the memory module controller is configured to load the data flushed to the non-volatile memory back to the volatile memory, after power of the main power is restored.

7. The server device of claim 1, wherein at least one of the plurality of memory modules further comprises field programmable gate arrays configured to perform an arithmetic operation for data stored in the non-volatile memory or the volatile memory.

8. The server device of claim 1, wherein at least one of the plurality of memory modules comprises an interface configured to transmit and receive data processed by a main controller of the host system without passing through a main memory of the host system.

9. The server device of claim 1, wherein
each of the plurality of memory modules and the at least one replaceable battery module is connected to a corresponding memory module connector from among the plurality of memory module connectors.

10. The server device of claim 1, further comprising:
an auxiliary power line configured to transmit the first auxiliary power from the at least one replaceable battery module to the plurality of memory modules.

11. The server device of claim 4, further comprising:
a switching block including at least one switch configured to supply one of the main power and the first auxiliary power to a memory module among the plurality of memory modules, in response to a first detection signal generated from the at least one replaceable battery module or the second detection signal generated from the plurality of memory modules.

12. A server device comprising:
a host system configured to supply a main power;
a backplane including a plurality of solid state drive (SSD) connectors configured to interface the host system to receive the main power and receive a signal;
a plurality of SSDs each connected to a respective one of the plurality of SSD connectors, the plurality of SSDs configured to receive the main power supplied from the host system via the backplane; and
at least one battery module connected to the backplane via at least one of the plurality of SSD connectors, the at least one battery module including a first power loss protection (PLP) block configured to detect power loss of the main power provided by the host system, and the at least one battery module configured to supply a first auxiliary power to the plurality of SSDs by connecting a charging circuit included in the at least one battery module to the backplane via the SSD connectors, in response to the first PLP block detecting the power loss of the main power reaching a sudden power off (SPO) state.

13. The server device of claim 12, wherein
the first PLP block is configured to generate a first detection signal, in response to the power loss of the main power reaches the SPO state, and
the host system comprises a baseboard management controller configured to block supplying the main power to a corresponding SSD connector among the plurality of SSD connectors, in response to the first detection signal.

14. The server device of claim 12, wherein the battery module is installed to a corresponding SSD connector from among the plurality of SSD connectors.

15. The server device of claim 12, wherein at least one of the plurality of SSDs comprises:
a second PLP block configured to detect the power loss of the main power; and
a second charging circuit configured to generate second auxiliary power, in response to the detected power loss of the main power from the second PLP block.

16. The server device of claim 12, wherein the first auxiliary power is supplied to the plurality of SSDs through the backplane or an auxiliary power line.

17. The server device of claim 12, further comprising:
a main power line configured to supply main power from the host system to the battery module,
wherein the battery module is connected to the host system through the main power line and configured to supply the first auxiliary power to a plurality of memory modules through the backplane.

18. A method of operating a server device, the server device including a backplane including a plurality of memory module connectors, a host system configured to supply a main power to the backplane, and a plurality of memory modules each connected to a respective one of the plurality of memory module connectors, the method comprising: supplying the main power to the plurality of memory module through the backplane; monitoring, by a first power loss protection (PLP) block included in a battery module connected to the backplane via at least one of the memory module connectors, a power loss of the main power; and supplying of first auxiliary power generated by a first charging circuit in the battery module to the memory module by a switch in the battery module connecting the first charging circuit to the backplane via the at least one of the memory module connectors, in response to the power loss of the main power being above a first reference value.

19. The method of claim 18, further comprising:
detecting of defects in the battery module performed at a same time with or sequentially after at least one of the supplying of the main power, monitoring of the power loss of the main power, and supplying of the first auxiliary power to the plurality of memory modules.

\* \* \* \* \*